(12) United States Patent
Tran et al.

(10) Patent No.: US 8,956,193 B2
(45) Date of Patent: Feb. 17, 2015

(54) HELICOIL SPRING BACKING SOCKET

(71) Applicants: Donald Tran, Phoenix, AZ (US); Srikant Nekkanty, Chandler, AZ (US)

(72) Inventors: Donald Tran, Phoenix, AZ (US); Srikant Nekkanty, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 13/712,000

(22) Filed: Dec. 12, 2012

(65) Prior Publication Data
US 2014/0162504 A1 Jun. 12, 2014

(51) Int. Cl.
H01R 13/24 (2006.01)
H01R 43/20 (2006.01)
G01R 11/00 (2006.01)
H01R 13/6599 (2011.01)
H01R 13/6461 (2011.01)

(52) U.S. Cl.
CPC ............... *H01R 43/20* (2013.01); *G01R 11/00* (2013.01); *H01R 13/2421* (2013.01); *H01R 13/6599* (2013.01); *H01R 13/6461* (2013.01); *H01R 2201/20* (2013.01)
USPC .............................. 439/700; 439/66

(58) Field of Classification Search
USPC .............. 439/700, 66, 246, 515, 607.12, 824
See application file for complete search history.

(56) References Cited

U.S. PATENT DOCUMENTS

| | | | | |
|---|---|---|---|---|
| 4,176,905 A | * | 12/1979 | Marechal | 439/824 |
| 4,743,201 A | * | 5/1988 | Robinson et al. | 439/10 |
| 5,518,410 A | * | 5/1996 | Masami | 439/71 |
| 6,033,233 A | * | 3/2000 | Haseyama et al. | 439/66 |
| 6,773,312 B2 | * | 8/2004 | Bauer et al. | 439/824 |
| 6,890,213 B2 | * | 5/2005 | Ohtsuki | 439/607.35 |
| 6,921,299 B2 | * | 7/2005 | McMaster | 439/700 |
| 6,958,616 B1 | * | 10/2005 | Mahoney et al. | 324/755.05 |
| 7,377,822 B1 | * | 5/2008 | Shen | 439/700 |
| 7,946,855 B2 | * | 5/2011 | Osato | 439/66 |

* cited by examiner

*Primary Examiner* — Gary Paumen
(74) *Attorney, Agent, or Firm* — Blakely, Sokoloff, Taylor & Zafman LLP

(57) ABSTRACT

Methods of forming a socket assembly and associated structures formed thereby are described. Those methods and structures may include forming a socket assembly comprising a socket body having a plurality of vertical openings, wherein contact assemblies are disposed within individual vertical openings. The contact assemblies comprise a compression spring surrounding an insulated conductive wire.

35 Claims, 7 Drawing Sheets

HELICOIL SPRING BACKING SOCKET

BACKGROUND OF THE INVENTION

Cross-talk among socket contacts has become a significant barrier for high speed signal rate in socket assemblies. To control cross-talk, prior art socket assemblies have been designed which sacrifice available socket contact positions by using them for ground shielding purposes. In some server socket applications, for example, it may be necessary to use as many one third of the socket contact population as ground-shielding. Using so many ground-contacts within a socket is not only costly, but it takes up an increasing amount of circuit board real-estate in an already tightly constrained platform.

BRIEF DESCRIPTION OF THE DRAWINGS

While the specification concludes with claims particularly pointing out and distinctly claiming certain embodiments, the advantages of these embodiments can be more readily ascertained from the following description of the invention when read in conjunction with the accompanying drawings in which:

DETAILED DESCRIPTION OF THE PRESENT INVENTION

Figure 1A:
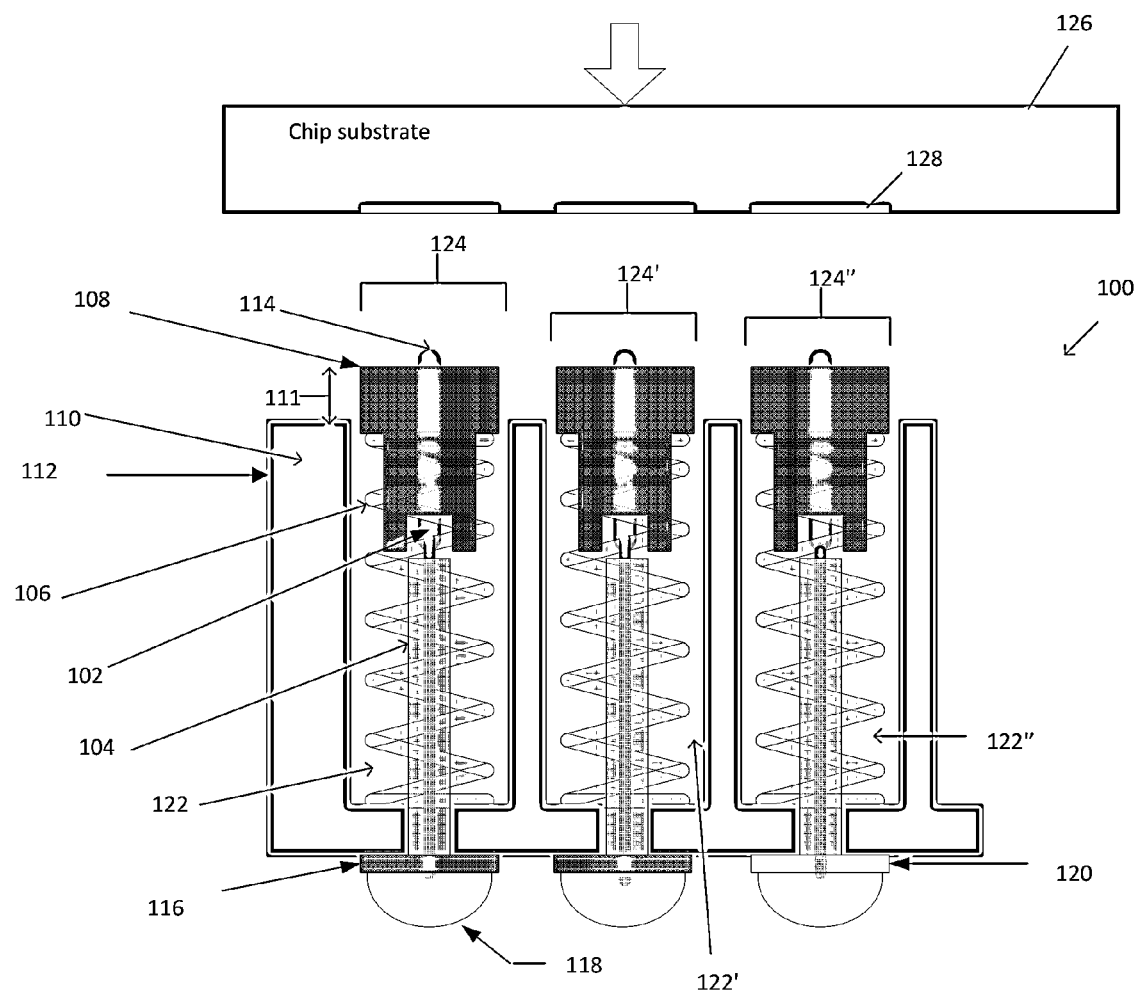
FIGS. 1a-1d represent structures according to various embodiments.

In the following detailed description, reference is made to the accompanying drawings that show, by way of illustration, specific embodiments in which the methods and structures may be practiced. These embodiments are described in sufficient detail to enable those skilled in the art to practice the embodiments. It is to be understood that the various embodiments, although different, are not necessarily mutually exclusive. For example, a particular feature, structure, or characteristic described herein, in connection with one embodiment, may be implemented within other embodiments without departing from the spirit and scope of the embodiments. In addition, it is to be understood that the location or arrangement of individual elements within each disclosed embodiment may be modified without departing from the spirit and scope of the embodiments. The following detailed description is, therefore, not to be taken in a limiting sense, and the scope of the embodiments is defined only by the appended claims, appropriately interpreted, along with the full range of equivalents to which the claims are entitled. In the drawings, like numerals may refer to the same or similar functionality throughout the several views.

Methods of forming socket assemblies, such as socket assemblies that may be associated with various microelectronic package structures, are described. Those methods/structures may include forming a socket assembly comprising a socket body having a plurality of vertical openings, wherein contact assemblies are disposed within individual vertical openings. The contact assemblies comprise a compression spring surrounding an insulated conductive wire. The use of the compression spring in the socket assembly provides the mechanical force to maintain electrical contact to a device. The socket assembly of the various embodiments disclosed herein greatly decreases the amount of crosstalk within the socket assembly and associated package structures.

FIGS. 1a-1d illustrate embodiments of microelectronic assemblies, such as a socket assembly with a helicoil spring. In an embodiment, a socket assembly 100 is depicted in FIG. 1a, wherein a conductive wire 102 is disposed within at least one vertical opening 122 disposed within a socket housing/body 110. The conductive wire 102 may comprise a flexible braided wire, and may comprise a diameter of less than about 1 mm in an embodiment. In another embodiment, the conductive wire may comprise a thickness of less than about 40 microns. In an embodiment, the conductive wire 102 may comprise a copper wire 102. In an embodiment, the conductive wire 102 may comprise an insulator material 104 that may surround and insulate the conductive wire 102. The insulator material 104 may comprise such materials as plastic, polyimide, etc. in some embodiments, but the insulator material 104 may vary depending upon the particular application.

A compression spring 106, which may comprise a helicoil spring 106 in some embodiments, may surround the insulated conductive wire 102, 104 within the at least one opening 122. The compression spring 106 may be pre-loaded. The compression spring 106 may comprise a deflection range of about 0.22 mm or less in some cases, and in embodiments it may comprise a deflection range of between about 0.22 mm and about 0.45 mm. The socket assembly 100 utilizing the compression spring 106 may provide superior mechanical performance as compared with prior art socket assemblies. The compression spring 106 does not comprise a primary electrical conductive path. The compression spring 106 may comprise a low cost, high strength material, such as steel or other such metal alloys, in some embodiments.

A spring cap 108, which may comprise an insulative material such as plastic for example, may be disposed on a contact terminal end 114 of the insulated conductive wire 102. A non-conductive washer 116 may be coupled to a solder end of the insulated conductive wire 102 that is opposite the contact terminal end 114 of the conductive wire 102. The washer may be disposed on an exterior portion of the socket body 110 as well. In some embodiments, the socket body 110 may comprise a conductive material. In other embodiments, the socket body 110 may comprise a non conductive material, such as plastic for example, with an exterior conductive coating 112. The spring cap 108 may extend a distance 111 from an exterior portion of the socket body 110. In an embodiment, a solder ball 118 may be disposed on/coupled to the washer 116. In an embodiment, the conductive wire 102 is shielded all around by the plated socket body 110, in a similar manner as that of a coaxial cable. This design thus achieves an extremely low level of cross-talk between solderballs 118.

In an embodiment, a contact assembly 124 comprising the conductive wire 102, the insulator 104 surrounding the conductive wire 102, the compressive spring 106, and may further comprise the spring cap 108 in some embodiments, may be vertically disposed within one of the plurality of openings 122 within the socket body 110. Adjacent contact assemblies 124' and 124" may be vertically disposed in adjacent openings 122', 122" within the socket body 110, in an embodiment. The number and positions of the plurality of contact assemblies and the plurality of openings 122 disposed within the socket body 110 may vary depending upon the particular application.

In an embodiment, a contact assembly may comprise a grounding contact assembly, such as the grounding contact assembly 124", wherein a conductive washer 120 that may comprise a metallic material, such as copper, or may be a metal coated plastic, for example. The number and placement of the grounding contact assemblies within the socket body 110 may vary depending upon the particular application. In an embodiment, a plurality of contact assemblies may be inserted into a plurality of vertical openings within the socket body, wherein at least one of the contact assemblies comprises a grounded contact assembly. A device substrate 126 may be provided that comprises contacts 128. The contacts 128 may comprise any suitable material or any suitable combination of materials, whether disposed in multiple layers or combined to form one or more alloys and/or one or more intermetallic compounds.

For example, the contacts may include copper, aluminum, gold, silver, nickel, titanium, tungsten, as well as any combination of these and/or other metals, or more non-metallic materials (e.g., a conductive polymer). The device substrate 126 may comprise one of a microelectronic memory die and a central processing unit die in some cases, but may comprise any type of suitable device 126 according to the particular application in other cases.

In an embodiment, the device substrate 126 may be coupled to a package structure (not shown) that may comprise a coreless, bumpless build up layer (BBUL) package structure. In an embodiment, such package structures may comprise any suitable type of package structures capable of providing electrical communications between a microelectronic device, such as a die, and a next-level component to which the package structures may be coupled (e.g., a circuit board). In another embodiment, the package structures may comprise any suitable type of package structures capable of providing electrical communication between a die and an upper integrated circuit (IC) package coupled with a lower IC package.

Figure 1B:
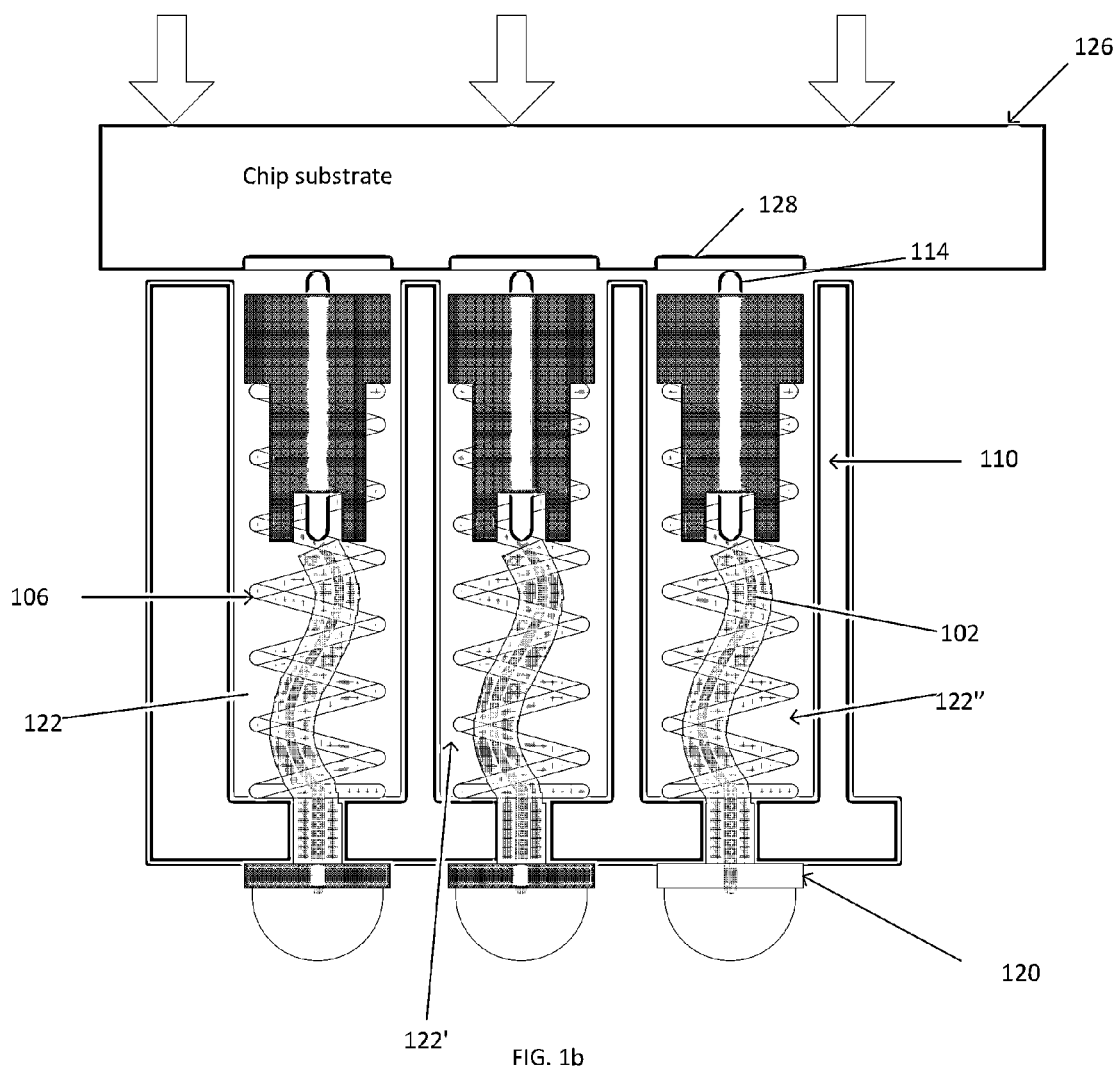

In an embodiment, the device substrate 126 may be attached/conductively coupled to the socket assembly 100 (FIG. 1b). The device 126 substrate may be coupled to the socket assembly 100 for testing purposes, or any other suitable function as required by the particular application (e.g., personal computers, servers, microservers, and other high speed digital communication applications). The helicoil spring 106 provides the mechanical force to maintain electrical contact between the socket assembly 100 and the device substrate 126. However, unlike prior art socket designs, the helicoil spring 106 is not a conductor for signals. Contacts 128 on the device substrate 126 may be coupled to the terminal ends 114 of the conductive wire 102 disposed within the opening 122 of the socket body 100. In an embodiment, a washer 120 may be coated with a conductive material, such as copper for example, to act as a grounding contact for the conductive wire 102.

Figure 1C:
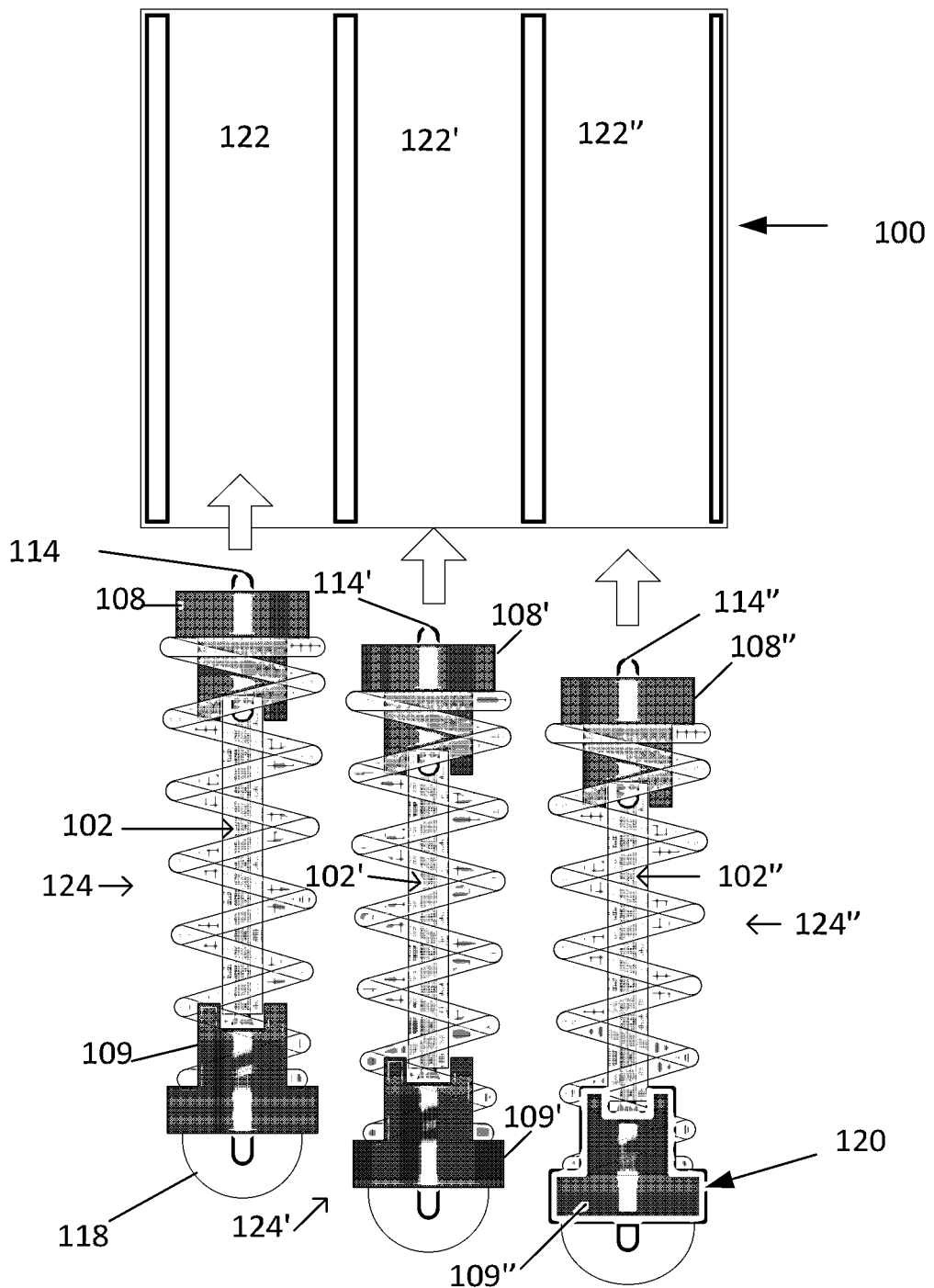

In an embodiment, contact assemblies 124, 124' 124" may be pre-assembled, wherein the respective insulated conductive wires 102, 102' 102" may be inserted/placed into the respective springs 106, 106',106" (FIG. 1c). In an embodiment, the conductive wires 106, 106', 106" may comprise insulated braided copper wire that may be placed inside the helical springs 106, 106',106". Terminal end spring caps 108, 108' 108" may be coupled with the terminal ends 114, 114' 114" of the conductive wires 102, 102', 102", and solder end spring caps 109, 109', 109" may be coupled with solder ends of the conductive wires 102, 102', 102" respectively. Solder balls 118 may optionally be coupled to the solder end spring caps before insertion into the solder body vertical openings.

Figure 1D:
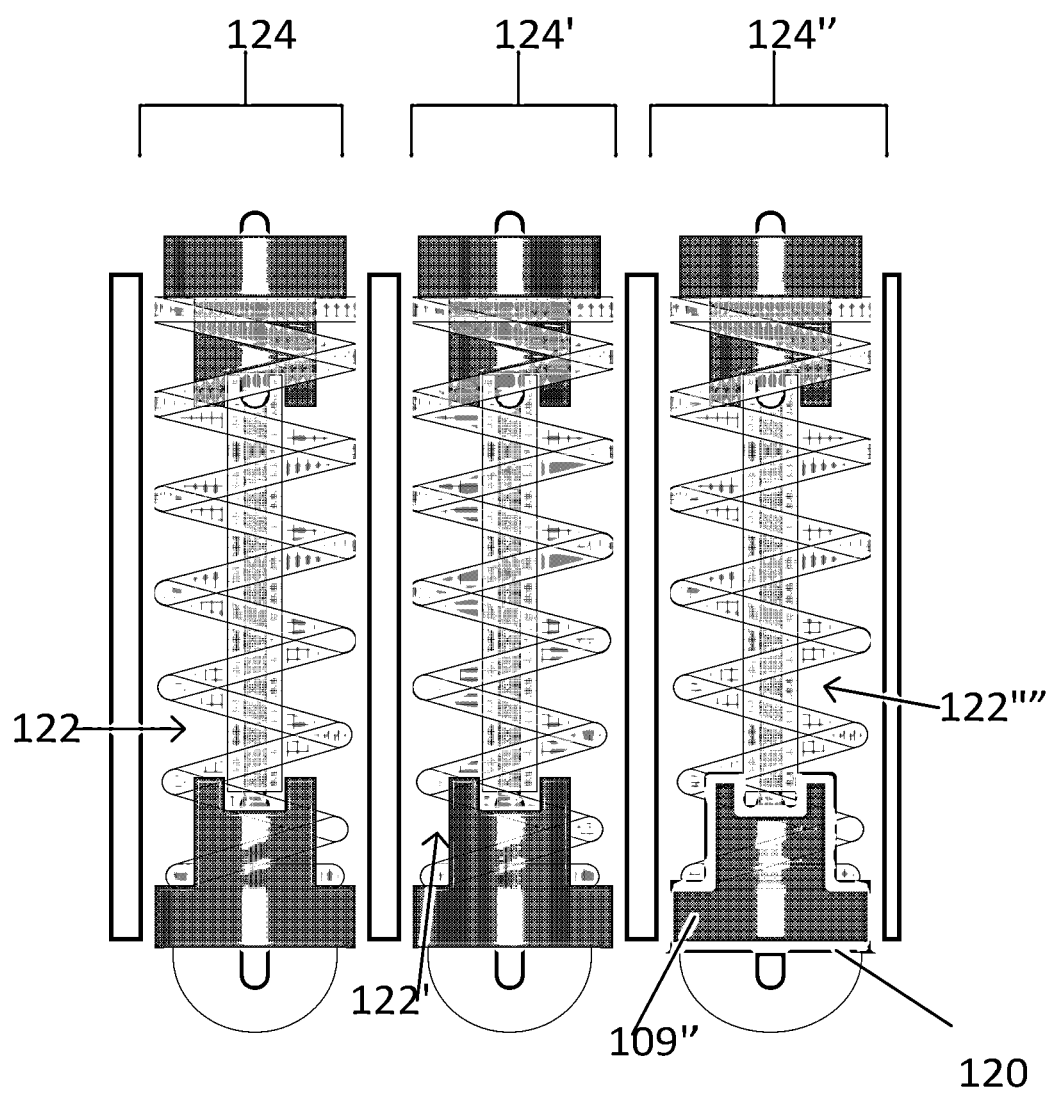

The preassembled contact assemblies 124, 124', 124" may then be inserted into the vertical openings 122, 122', 122" of the socket body 110 respectively (FIG. 1d). In another embodiment, the solder ends of the preassembled contact assemblies may be inserted through the vertical openings in the socket body, and then solderballs 118 may be attached after insertion. In an embodiment, at least one of the solder end spring caps (for example solder end spring cap 109") coupled to a contact assembly (for example contact assembly 124") may be coated with conductive material 120, so that the contact assembly acts as a grounding contact assembly 124"'.

Figure 2:
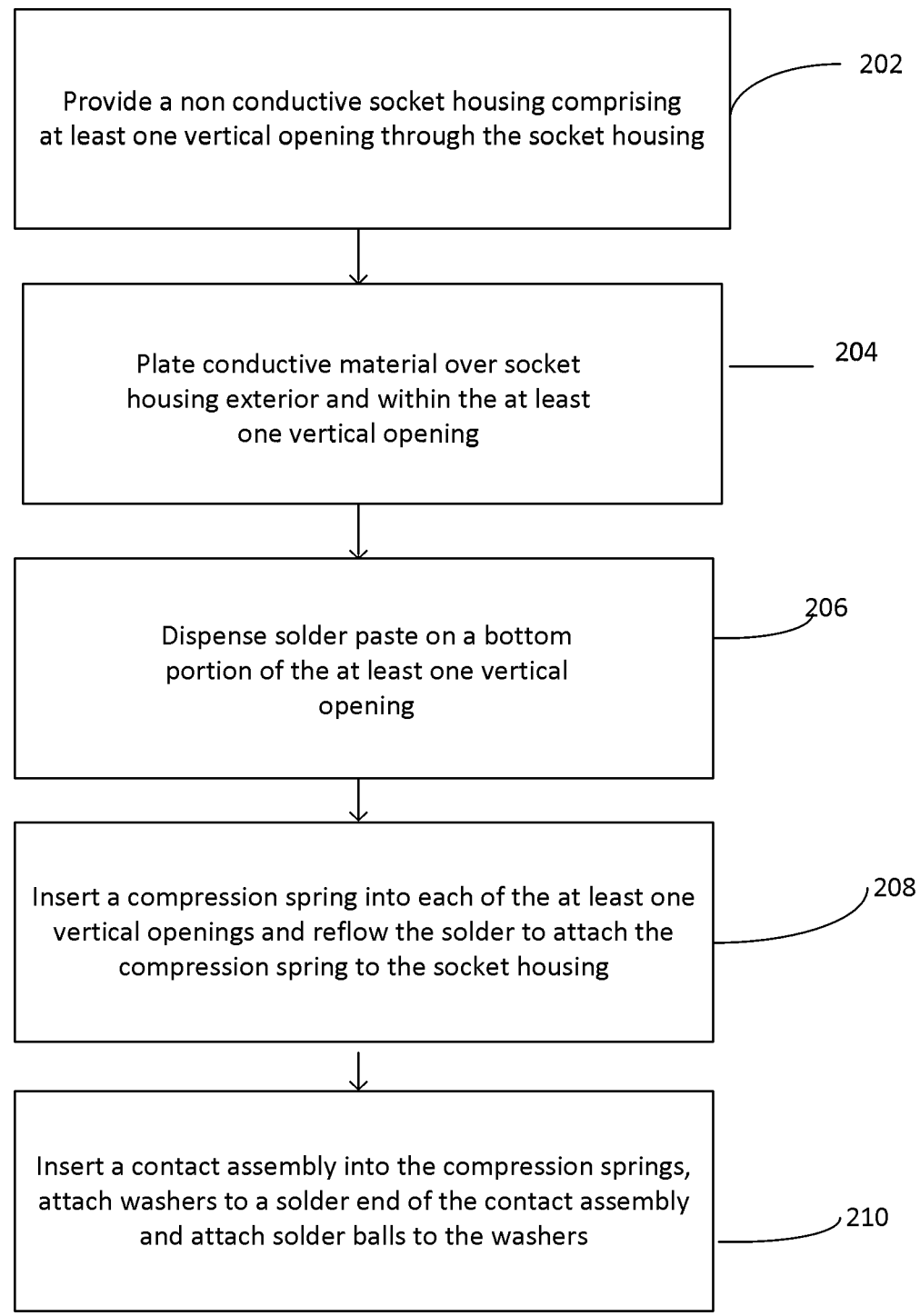
FIG. 2 represents a method according to various embodiments.

In another embodiment, a method of socket assembly is depicted in FIG. 2. At step 202, a non-conductive socket housing is provided comprising at least one vertical opening through the socket housing. At step 204, a conductive material is plated over the exterior of the socket housing and within the at least one vertical opening. At step 206, a solder paste is dispensed on a bottom portion of the at least one vertical opening. At step 208, compression springs are inserted into the at least one vertical openings and the solder is reflowed to attach the compression springs to the socket housing. At step 210, insulated contact assemblies are inserted into each of the compression springs, and washers are attached to a solder end of the contact assemblies and solder balls are attached to the washers.

The various embodiments of the socket assembly herein use a helical spring to provide the mechanical force to maintain electrical contact to a device, without necessitating the use of the spring as a signal conductor. The embodiments minimize the need for using contacts as ground shields, which results in the ability to reduce device package size. Cross-talk and insertion loss are reduced, and the socket embodiments herein improve channel length and/or signal rate. The socket body herein does not require very thin wall features as in some prior art ground shielding designs, and unlike some prior art designs the embodiments do not require selective plating of the socket body. Low cost plating processes such as electrolytic/electroless plating can thus be utilized. The contact assemblies of the socket embodiments herein are robust, and will are relatively resistant to becoming bent or damaged. Since the contacts of the embodiments are insulated and further away from the ground shield than prior art designs, the risk of shorting is low.

Figure 3:
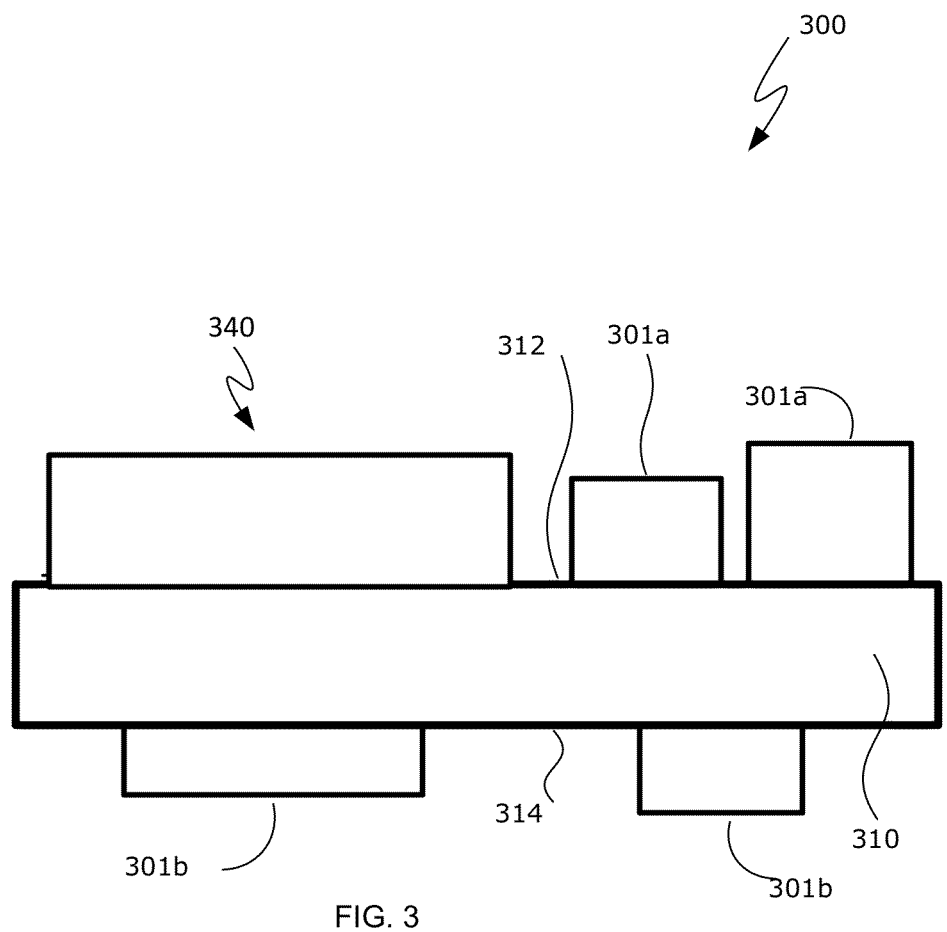
FIG. 3 represents structures according to embodiments.

Turning now to FIG. 3, illustrated is an embodiment of a computing system 300. The system 300 includes a number of components disposed on a mainboard 310 or other circuit board. Mainboard 310 includes a first side 312 and an opposing second side 314, and various components may be disposed on either one or both of the first and second sides 312, 314. In the illustrated embodiment, the computing system 300 includes a package structure 340, which may be coupled with a socket assembly similar to the embodiments herein, to couple the package structure 340 to the mainboard's first side 312.

System 300 may comprise any type of computing system, such as, for example, a hand-held or mobile computing device (e.g., a cell phone, a smart phone, a mobile internet device, a music player, a tablet computer, a laptop computer, a nettop computer, etc.). However, the disclosed embodiments are not limited to hand-held and other mobile computing devices and these embodiments may find application in other types of computing systems, such as desk-top computers and servers.

Mainboard 310 may comprise any suitable type of circuit board or other substrate capable of providing electrical communication between one or more of the various components disposed on the board. In one embodiment, for example, the mainboard 310 comprises a printed circuit board (PCB) comprising multiple metal layers separated from one another by a layer of dielectric material and interconnected by electrically conductive vias. Any one or more of the metal layers may be formed in a desired circuit pattern to route—perhaps in conjunction with other metal layers—electrical signals between the components coupled with the board 310. However, it should be understood that the disclosed embodiments are not limited to the above-described PCB and, further, that mainboard 310 may comprise any other suitable substrate.

In addition to the package structure 340, one or more additional components may be disposed on either one or both sides 312, 314 of the mainboard 310. By way of example, as shown in the figures, components 301a may be disposed on the first side 312 of the mainboard 310, and components 301b may be disposed on the mainboard's opposing side 314. Additional components that may be disposed on the mainboard 310 include other IC devices (e.g., processing devices, memory devices, signal processing devices, wireless communication devices, graphics controllers and/or drivers, audio processors and/or controllers, etc.), power delivery components (e.g., a voltage regulator and/or other power management devices, a power supply such as a battery, and/or passive devices such as a capacitor), and one or more user interface devices (e.g., an audio input device, an audio output device, a keypad or other data entry device such as a touch screen display, and/or a graphics display, etc.), as well as any combination of these and/or other devices.

In one embodiment, the computing system 300 includes a radiation shield. In a further embodiment, the computing system 300 includes a cooling solution. In yet another embodiment, the computing system 300 includes an antenna. In yet a further embodiment, the assembly 300 may be disposed within a housing or case. Where the mainboard 310 is disposed within a housing, some of the components of computer system 300—e.g., a user interface device, such as a display or keypad, and/or a power supply, such as a battery—may be electrically coupled with the mainboard 310 (and/or a component disposed on this board) but may be mechanically coupled with the housing.

Figure 4:
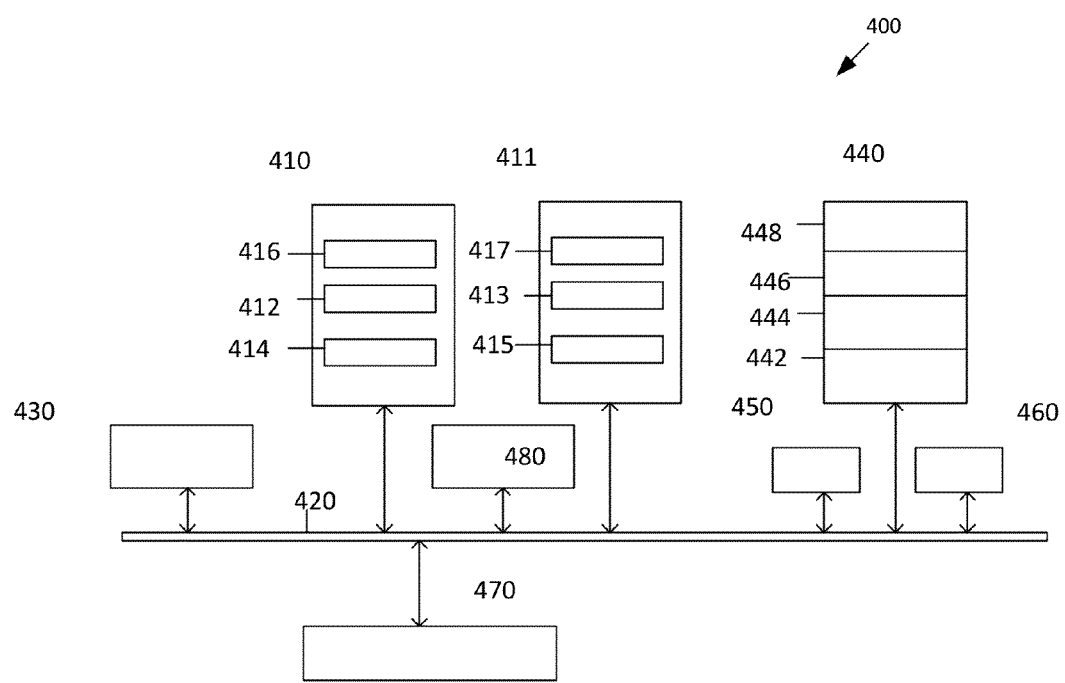
FIG. 4 represents a system according to embodiments.

FIG. 4 is a schematic of a computer system 400 according to an embodiment. The computer system 400 (also referred to as the electronic system 400) as depicted can embody/include a socket assembly according to any of the several disclosed embodiments and their equivalents as set forth in this disclosure. The computer system 400 may be a mobile device such as a netbook computer. The computer system 400 may be a mobile device such as a wireless smart phone. The computer system 400 may be a desktop computer. The computer system 400 may be a hand-held reader. The computer system 400 may be integral to an automobile. The computer system 400 may be integral to a television.

In an embodiment, the electronic system 400 is a computer system that includes a system bus 420 to electrically couple the various components of the electronic system 400. The system bus 420 is a single bus or any combination of busses according to various embodiments. The electronic system 400 includes a voltage source 430 that provides power to the integrated circuit 410. In some embodiments, the voltage source 430 supplies current to the integrated circuit 410 through the system bus 420.

The integrated circuit 410 is electrically, communicatively coupled to the system bus 420 and includes any circuit, or combination of circuits according to an embodiment, including the package/device of the various embodiments included herein. In an embodiment, the integrated circuit 410 includes a processor 412 that can include any type of packaging structures according to the embodiments herein. As used herein, the processor 412 may mean any type of circuit such as, but not limited to, a microprocessor, a microcontroller, a graphics processor, a digital signal processor, or another processor. In an embodiment, the processor 412 includes any of the embodiments of the package/socket assembles disclosed herein. In an embodiment, SRAM embodiments are found in memory caches of the processor.

Other types of circuits that can be included in the integrated circuit 410 are a custom circuit or an application-specific integrated circuit (ASIC), such as a communications circuit 414 for use in wireless devices such as cellular telephones, smart phones, pagers, portable computers, two-way radios, and similar electronic systems. In an embodiment, the processor 412 includes on-die memory 416 such as static random-access memory (SRAM). In an embodiment, the processor 412 includes embedded on-die memory 416 such as embedded dynamic random-access memory (eDRAM).

In an embodiment, the integrated circuit 410 is complemented with a subsequent integrated circuit 411. In an embodiment, the dual integrated circuit 411 includes embedded on-die memory 417 such as eDRAM. The dual integrated circuit 411 includes an RFIC dual processor 413 and a dual communications circuit 415 and dual on-die memory 417 such as SRAM. The dual communications circuit 415 may be configured for RF processing.

At least one passive device 480 is coupled to the subsequent integrated circuit 411. In an embodiment, the electronic system 400 also includes an external memory 440 that in turn may include one or more memory elements suitable to the particular application, such as a main memory 442 in the form of RAM, one or more hard drives 444, and/or one or more drives that handle removable media 446, such as diskettes, compact disks (CDs), digital variable disks (DVDs), flash memory drives, and other removable media known in the art. The external memory 440 may also be embedded memory 448. In an embodiment, the electronic system 400 also includes a display device 450, and an audio output 460. In an embodiment, the electronic system 400 includes an input device such as a controller 470 that may be a keyboard, mouse, touch pad, keypad, trackball, game controller, microphone, voice-recognition device, or any other input device that inputs information into the electronic system 400. In an embodiment, an input device 470 includes a camera. In an embodiment, an input device 470 includes a digital sound recorder. In an embodiment, an input device 470 includes a camera and a digital sound recorder.

Although the foregoing description has specified certain steps and materials that may be used in the methods of the embodiments, those skilled in the art will appreciate that many modifications and substitutions may be made. Accordingly, it is intended that all such modifications, alterations, substitutions and additions be considered to fall within the spirit and scope of the embodiments as defined by the appended claims. In addition, the Figures provided herein illustrate only portions of exemplary devices/socket assemblies and associated package structures that pertain to the practice of the embodiments. Thus the embodiments are not limited to the structures described herein.

What is claimed is:

1. A method of forming a socket assembly comprising:
   providing a socket body comprising a plurality of vertical openings; and
   inserting a contact assembly within individual vertical openings, wherein the contact assembly comprises a compression spring surrounding an insulated conductive wire.

2. The method of claim 1 further comprising wherein the contact assembly is preassembled prior to insertion into the socket body.

3. The method of claim 1 further comprising wherein a plurality of contact assemblies are inserted into a plurality of vertical openings within the socket body, wherein at least one of the contact assemblies comprises a grounded contact assembly.

4. The method of claim 1 further comprising wherein the compression spring is non-conductive.

5. The method of claim 1 further comprising wherein the contact assembly comprises an insulated braided conductive wire disposed within a helical compression spring, wherein a terminal end of the conductive wire is attached to a spring cap, and a solder end of the conductive wire is attached to a solderball.

6. The method of claim 1 further comprising wherein the socket body comprises a nonconductive socket body that is plated with a conductive material.

7. The method of claim 5 further comprising wherein the solder ball is coupled with a washer.

8. The method of claim 7 further comprising wherein the washer is coated with a conductive material to provide a grounding contact assembly.

9. The method of claim 1 further comprising wherein the compressive spring is pre-loaded.

10. The method of claim 1 further comprising wherein the socket body comprises a metallic socket body.

11. The method of claim 3 further comprising wherein a solder end spring cap is attached to a solder end of the conductive wire of the plurality of contact assemblies.

12. The method of claim 11 further comprising wherein at least one of the solder end spring caps comprises a grounding spring cap.

13. The method of claim 5 further comprising wherein the insulated braided conductive wire comprises less than about 1 mm in diameter.

14. The method of claim 1 further comprising wherein the socket assembly is coupled with a device substrate.

15. The method of claim 14 further comprising wherein the device substrate further comprises a package structure.

16. The method of claim 1 further comprising dispensing solder on a bottom portion of the vertical openings, and then reflowing the solder to attach the compression springs to the socket body.

17. The method of claim 1 further comprising inserting a washer on a bottom portion and an insulator on a top portion of the vertical opening to seal the vertical opening.

18. A socket assembly comprising:
   a socket body comprising a plurality of vertical openings; and
   a contact assembly disposed within individual vertical openings, wherein the contact assembly comprises a compression spring surrounding an insulated conductive wire.

19. The assembly of claim 18 further comprising wherein the socket assembly comprises a plurality of contact assemblies disposed within the plurality of vertical openings, wherein at least one of the contact assemblies comprises a grounded contact assembly.

20. The assembly of claim 18 further comprising wherein the compression spring is non-conductive.

21. The assembly of claim 18 further comprising wherein the contact assembly comprises an insulated braided conductive wire disposed within a helical compression spring, wherein a terminal end of the conductive wire is attached to a spring cap, and a solder end of the conductive wire is attached to a solderball.

22. The assembly of claim 18 further comprising wherein the socket body comprises a nonconductive socket body comprising a conductive material disposed on an exterior portion of the socket body.

23. The assembly of claim 21 further comprising wherein the solder ball is coupled with a washer.

24. The assembly of claim 23 further comprising wherein the washer is coated with a conductive material to provide a grounding contact assembly.

25. The assembly of claim 18 further comprising wherein the compressive spring is pre-loaded.

26. The assembly of claim 18 further comprising wherein the socket body comprises a metallic socket body.

27. The assembly of claim 19 further comprising wherein a solder end spring cap is attached to a solder end of the conductive wire of the plurality of contact assemblies.

28. The assembly of claim 27 further comprising wherein at least one of the solder end spring caps comprises a grounding spring cap.

29. The assembly of claim 21 further comprising wherein the insulated braided conductive wire comprises less than about 1 mm in diameter.

30. The assembly of claim 18 further comprising a washer disposed on a bottom portion and an insulator disposed on a top portion of the vertical opening capable of sealing the vertical opening.

31. A socket assembly comprising:
   a conductive material disposed on a socket housing comprising vertical openings;
   a solder on a bottom portion of the vertical openings;
   a compression spring disposed within the vertical openings and wherein an end of the compression spring is attached to the solder;
   a contact assembly disposed within the compression spring, wherein the contact assembly comprises a compression spring surrounding an insulated conductive wire; and
   a spring cap coupled to a terminal end of the conductive wire.

32. The assembly of claim 31 further comprising a device substrate coupled to the socket assembly.

33. The structure of claim 32 further comprising a package structure coupled to the device substrate.

34. The structure of claim 32 wherein the package structure further comprises at least one of a CPU and a memory die.

35. The structure of claim 33 further comprising a system comprising: a bus communicatively coupled to the package structure; and an eDRAM communicatively coupled to the bus.

* * * * *